United States Patent
Suzuki et al.

(10) Patent No.: US 7,225,372 B2
(45) Date of Patent: *May 29, 2007

(54) TESTING BOARD FOR SEMICONDUCTOR MEMORY, METHOD OF TESTING SEMICONDUCTOR MEMORY AND METHOD OF MANUFACTURING SEMICONDUCTOR MEMORY

(75) Inventors: Iwao Suzuki, Hamura (JP); Shuji Kikuchi, Yokohama (JP); Fumie Kobayashi, Fussa (JP); Hideyuki Aoki, Takasaki (JP)

(73) Assignee: Renesas Technology Corp & Hitachi ULSI Systems Co., Ltd., Tokyo (JP)

( * ) Notice: Subject to any disclaimer, the term of this patent is extended or adjusted under 35 U.S.C. 154(b) by 178 days.

This patent is subject to a terminal disclaimer.

(21) Appl. No.: 10/949,192

(22) Filed: Sep. 27, 2004

(65) Prior Publication Data
US 2005/0044458 A1  Feb. 24, 2005

Related U.S. Application Data (63) Continuation of application No. 09/994,638, filed on Nov. 28, 2001, now Pat. No. 6,826,720.

(30) Foreign Application Priority Data
Nov. 30, 2000  (JP) .............................. 2000-364380

(51) Int. Cl.
*G11C 29/00* (2006.01)

(52) U.S. Cl. ...................................... 714/720; 714/718
(58) Field of Classification Search ................ 714/733, 714/724, 718, 720, 738; 365/200; 703/22
See application file for complete search history.

(56) References Cited

U.S. PATENT DOCUMENTS

| | | | |
|---|---|---|---|
| 4,293,950 A | 10/1981 | Shimizu et al. | |
| 5,764,655 A * | 6/1998 | Kirihata et al. ............. | 714/733 |
| 6,138,257 A | 10/2000 | Wada et al. | |
| 6,233,182 B1 * | 5/2001 | Satou et al. ................. | 365/200 |
| 6,340,823 B1 | 1/2002 | Kitade | |
| 6,445,627 B1 * | 9/2002 | Nakahara et al. ........... | 365/200 |
| 6,480,869 B1 | 11/2002 | Fujioka | |
| 6,567,941 B1 * | 5/2003 | Turnquist et al. ........... | 714/724 |
| 6,631,344 B1 * | 10/2003 | Kapur et al. .................. | 703/22 |
| 6,727,723 B2 | 4/2004 | Shimizu et al. | |

FOREIGN PATENT DOCUMENTS

WO  WO98/47152  10/1998

* cited by examiner

*Primary Examiner*—David Ton
(74) *Attorney, Agent, or Firm*—Mattingly, Stanger, Malur & Brundidge, P.C.

(57) ABSTRACT

A testing circuit using ALPG is mounted in a testing board in which sockets for mounting semiconductor memories as devices to be tested in the board is mounted and a volatile memory for storing a data table for generating a random pattern is provided in the testing circuit so that a test using a test pattern having no regularity is performed using the data table in addition to a test using a test pattern having regularity generated by the ALPG.

6 Claims, 10 Drawing Sheets

TESTING BOARD FOR SEMICONDUCTOR MEMORY, METHOD OF TESTING SEMICONDUCTOR MEMORY AND METHOD OF MANUFACTURING SEMICONDUCTOR MEMORY

CROSS-REFERENCE TO RELATED APPLICATION

This is a continuation of application Ser. No. 09/994,638, filed Nov. 28, 2001, which is now U.S. Pat. No. 6,826,720.

BACKGROUND OF THE INVENTION

The present invention relates to a testing board for semiconductor memories, method of testing semiconductor memories and a method of manufacturing semiconductor memories and more particularly to technique effective for application to a testing board in which a testing circuit using an ALPG (Algorithmic Memory Pattern Generator) and sockets used to mount semiconductor memories on the testing board as devices to be tested are mounted, a testing method using the testing board and a manufacturing method of semiconductor memories.

Heretofore, a test for semiconductor memories such as RAMs (Random Access Memories) is carried out by a testing apparatus named a memory tester. The memory tester generates a test pattern (address and data) and supplies the semiconductor memories to be tested with the test pattern to be written in memory cells of the semiconductor memories. Then, data written in the memory cells are read out by the memory tester, so that the read-out data are compared with expected values within the memory tester to judge whether the data are identical with the expected values so that the semiconductor memories are diagnosed.

Figure 11:
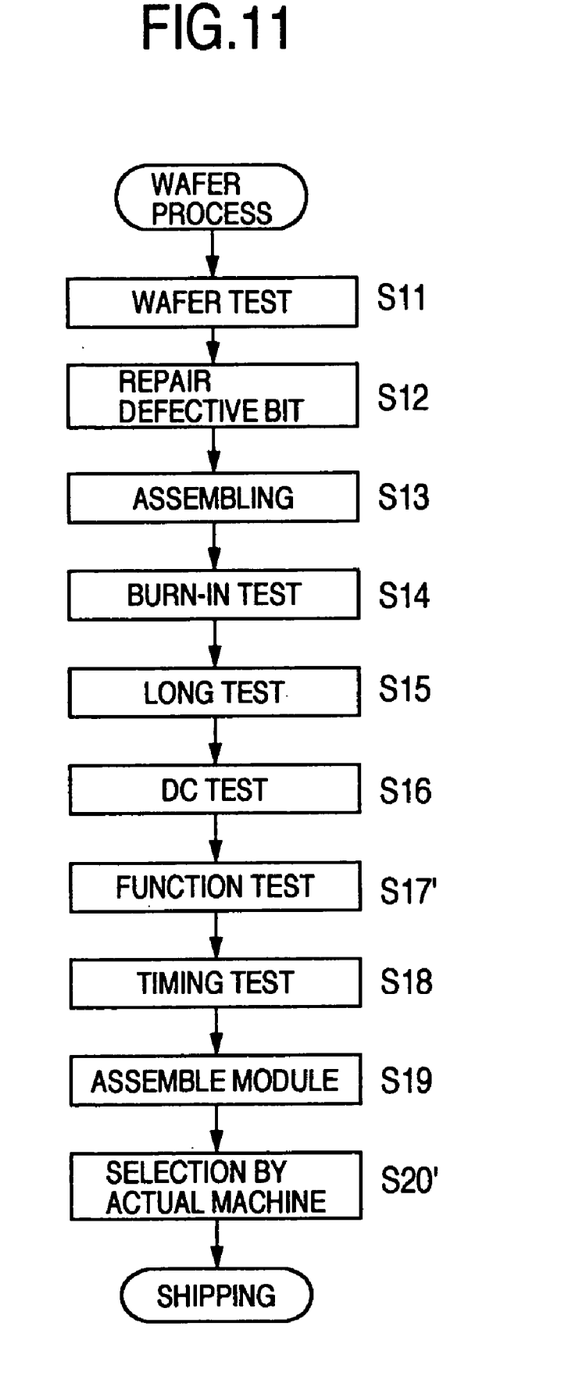
FIG. 11 is a flow chart showing a conventional test procedure for semiconductor memories.

Procedure from manufacture to shipping of semiconductor memories is generally made as shown in FIG. 11. That is, after a plurality of semiconductor memories have been formed on a wafer in a semiconductor manufacturing process, probes come into contact with pads of the semiconductor memories being formed on the wafer to supply test signals thereto and receive output signals in response to the test signals so that the test using the probes is performed (step S11). The semiconductor memories are classified into repairable devices and non-repairable devices on the basis of the test result. With respect to the repairable devices, a redundant circuit provided within each memory is used to replace a defective bit with a spare memory cell (step S12).

Next, the wafer in which the plurality of semiconductor memories are formed is cut into respective chips and each chip is enclosed or sealed by means of resin to be assembled into a package (step S13). The semiconductor memories each assembled into the package are subjected to a high-temperature test (burn-in test) by means of a burn-in apparatus and to a low-speed operation test (long test) by means of a signal such as a clock having a low operation frequency to thereby remove a device having unstable operation on the basis of the test result (steps S14 and S15).

Then, a high-speed memory tester is used to perform a DC test for testing whether the semiconductor memories have a desired DC voltage characteristic by applying a DC voltage to the semiconductor memories, a function test for testing whether circuits are operated normally at usual operation speed with original operation frequency signals, and a timing test for testing whether a set-up time and a hold time of the semiconductor memories satisfy design specification successively (steps S16, S17' and S18).

The semiconductor memories regarded as non-defective devices are used to assemble a memory module. The memory module is mounted on a mother board of a computer and is subjected to a selection test by means of an actual machine. Only the memory module judged as a normally operated module is shipped as a product (step S19 and S20').

In the prior art as described above, since the test performed using the memory tester has a lot of test items, there is a problem that the test time is increased and a cost required for the test is increased. In other words, since the number of memories capable of being tested by the memory tester is very small as compared with the burn-in apparatus or the like, the test time is very increased if all of memories are to be tested by means of the limited number of memory testers and since the number of memory testers must be increased if the test is to be completed in a short time, the cost of equipment is very increased.

Further, since the test using the tester is made in accordance with a test pattern having the regularity according to a predetermined algorithm, any defective memory can be sometimes detected even from the memories judged as non-defective devices in the test using the tester if the memories are subjected to the test using a random test pattern. Accordingly, in the conventional test method using the tester, even when the test has been performed using the expensive tester at great pains, it is disadvantageous that the test using the random test pattern must be performed by the actual machine again after the memories have been assembled in a module.

On the other hand, there is proposed an invention that a testing circuit including a test pattern generator named ALPG for generating a memory test pattern in accordance with a predetermined algorithm is mounted in a memory chip to test a memory array by itself so that the frequency in use of the memory tester can be reduced (International Publication WO 98/47152). However, when the ALPG is mounted in the memory chip as in the above invention, it is disadvantageous that the yield is reduced due to a defect of the ALPG itself and the size of the memory chip is increased.

In this connection, the specification of the above invention discloses that the testing circuit having the above-mentioned configuration is structured as a semiconductor integrated circuit separated from the memory chip and the semiconductor integrated circuit and the memory chips are mounted on a board so that the self-test thereof can be realized even in the assembled state in a memory module. However, even the publication of the above invention does not quite disclose the test using a random pattern.

SUMMARY OF THE INVENTION

It is an object of the present invention to provide a testing board for semiconductor memories, a testing method and a manufacturing method of the semiconductor memories capable of decreasing the number of testers used in a test and having high speed and high function to reduce the cost of equipment.

It is another object of the present invention to provide a testing board for semiconductor memories, a testing method and a manufacturing method of the semiconductor memories capable of shortening a time required for a test.

It is still another object of the present invention to provide a testing board for semiconductor memories, a testing method and a manufacturing method of the semiconductor memories capable of testing semiconductor memories without reduction in the yield of memory chips and increase in size of the memory chips.

Representatives of the inventions disclosed in the present application are summarized as follows.

According to an aspect of the present invention, a testing circuit using an ALPG is mounted in a testing board in which sockets for mounting semiconductor memories in the board as devices to be tested are mounted and a volatile memory for storing a data table for generating a random pattern is included in the testing board, so that a test using a test pattern having no regularity using the data table is performed in addition to a test using a test pattern having regularity generated by the ALPG.

More particularly, the testing board according to the present invention includes a plurality of sockets in which semiconductor memories to be tested are mounted, a testing circuit for generating addresses and data used for test of the semiconductor memories in accordance with a predetermined algorithm, terminals for connecting the testing circuit to an external control apparatus, and wiring for electrically connecting the sockets, the testing circuit and the terminals, and the testing circuit comprises a volatile memory for storing data forming the basis for generating data used in a test using a test pattern having no regularity, and data generating means for reading out the data from the volatile memory to generate data for the test.

According to the aspect of the present invention described above, since the semiconductor memories can be tested in accordance with the predetermined algorithm by means of the testing circuit on the testing board equipped with the sockets for mounting the semiconductor memories to be tested in the board, a desired test can be performed without using any high-speed and high-function tester and the test using the test pattern having no regularity can be also performed by the testing circuit. Accordingly, the test which is heretofore performed by an actual machine can be performed by a simple and inexpensive testing apparatus such as a burn-in apparatus and further a large number of semiconductor memories can be tested by the testing apparatus at the same time. Moreover, optimum data can be stored in the volatile memory in accordance with contents of the test to perform the test efficiently.

The testing circuit preferably comprises a buffer memory for holding the data generated by the data generating means, and a comparison and judgment circuit for comparing the data stored in the buffer memory with data read from the semiconductor memory mounted in the socket to detect whether both the data are coincident with each other or not. Accordingly, an external control apparatus can obtain a comparison and judgment result from the testing circuit on the board without reading out the data written in the semiconductor memory and making comparison and judgment of the read-out data with respect to expected data.

According to another aspect of the present invention, the testing board includes a plurality of sockets in which semiconductor memories to be tested are mounted, a testing circuit for generating data and addresses used for test of the semiconductor memories in accordance with a predetermined algorithm, a buffer circuit having a buffer memory for holding the data generated by the testing circuit and a comparison and judgment circuit for comparing the data stored in the buffer memory with data read from the semiconductor memory mounted in the socket to detect whether both the data are coincident with each other or not, terminals for connecting the testing circuit to an external control apparatus, and wiring for electrically connecting the sockets, the buffer circuit, the testing circuit and the terminals, and the testing circuit may comprise a volatile memory for storing data forming the basis for generating data used in a test using a test pattern having no regularity, and data generating means for reading out the data from the volatile memory to generate data for the test.

According to the aspects of the present invention described above, since the semiconductor memories can be tested in accordance with the predetermined algorithm by means of the testing circuit on the testing board equipped with the sockets in which the semiconductor memories to be tested are mounted, a desired test can be performed without using any high-speed and high-function tester and the test using the test pattern having no regularity can be also performed by the testing circuit. Accordingly, the test which is heretofore performed by an actual machine can be performed by a simple and inexpensive testing apparatus such as a burn-in apparatus and further a large number of semiconductor memories can be tested by the testing apparatus at the same time. Moreover, an external control apparatus can obtain a comparison and judgment result from the testing circuit on the board without reading out the data written in the semiconductor memory and making comparison and judgment of the read-out data with respect to expected data. In addition, since the testing circuit is not required to be included in the semiconductor memories to be tested, the semiconductor memories can be tested without reducing the yield of memory chips and increasing a chip size.

Furthermore, the testing circuit preferably comprises data indication means for successively generating an address for data to be next read out from the volatile memory. Accordingly, next data can be easily read out from the volatile memory and the order of addresses produced by the data indication means can be changed to thereby enhance the randomness of data read out from the volatile memory.

Further, the testing circuit comprises an address generation unit for generating an address to be supplied to the semiconductor memories mounted in the sockets, a data generation unit for generating data to be supplied to the semiconductor memories mounted in the sockets, and a control unit for controlling the address generation unit and the data generation unit to successively produce a test pattern according to a predetermined algorithm. Accordingly, since the semiconductor memories can be performed in accordance with the predetermined algorithm by means of the testing circuit on the testing board, a desired test can be performed without using any high-speed and high-function tester and a cost required for the test can be reduced. Since a large number of semiconductor memories can be tested at the same time, time required for the test can be shortened.

Moreover, the control unit comprises a memory for storing a program composed of a plurality of control codes, and a program counter for generating an address indicating the control code to be read out from the memory. Accordingly, the control unit capable of controlling the address generation unit and the data generation unit to generate the test pattern in the predetermined algorithm efficiently can be configured.

Further, the memory for storing the program composed of the control codes comprises a volatile memory. Accordingly, each time a test having different contents is performed, the program can be transferred to thereby reduce the capacity of the memory for storing the program and when a more efficient program or a new test is developed, correction and addition with respect to the program and the test can be made easily.

Furthermore, the data generation unit comprises two or more data operation systems each including operation means for performing operation processing to the data read out from the volatile memory and a register for holding an operation result, and data selection means for selecting any of data processed by the data operation systems to be outputted. Accordingly, the test data can be generated at high speed by means of parallel processing of the two data operation systems.

Further, the data operation systems each include a path for feeding back data held in the register to the operation means. Accordingly, since the data once used can be fed back to the operation means and be operated to thereby change the data, more random data can be generated even if the data previously stored in the volatile memory are reduced.

The data-indication means includes a memory for holding addresses indicating data to be read out from the volatile memory, and the memory comprises a volatile memory. Accordingly, the order of reading out the data can be changed in accordance with the contents of the test to thereby perform efficient test.

According to another aspect of the present invention, the testing method of semiconductor memories comprises a first test process of testing a plurality of semiconductor memory chips formed on a wafer, a second test process of testing semiconductor memories cut from the wafer and packed into a package under a high temperature, and a third test process of mounting the semiconductor memories subjected to the second test process in a plurality of sockets of a testing board in which the plurality of sockets, a testing circuit for generating addresses and data used for test of the semiconductor memories in accordance with a predetermined algorithm and including a volatile memory for storing data forming the basis for generating data used in a test using a test pattern having no regularity and data generating means for reading out the data from the volatile memory to generate data for the test, terminals for connecting the testing circuit to an external control apparatus, wiring for electrically connecting the sockets, the testing circuit and the terminals are formed, so that the semiconductor memories mounted in the plurality of sockets are tested by the testing circuit.

According to the test method described above, since the semiconductor memories can be tested in accordance with the predetermined algorithm by means of the testing circuit on the testing board including the sockets for mounting the semiconductor memories to be tested, a desired test can be performed without using any high-speed and high-function tester and the test using the test pattern having no regularity can be also performed by the testing circuit. Accordingly, the test which is heretofore performed by an actual machine can be performed by a simple and inexpensive testing apparatus such as a burn-in apparatus and further a large number of semiconductor memories can be tested by the testing apparatus at the same time.

Further, it is preferable that the third test process is performed by the same apparatus as the apparatus used in the second test process. A conventional testing apparatus can be utilized as it is without developing a new testing apparatus to thereby reduce the cost of equipment for test.

According to another aspect of the present invention, a manufacturing method of semiconductor memories comprises a first test process for testing a plurality of semiconductor memory chips formed on a wafer, a process of cutting each of the semiconductor memory chips from the wafer, a process of packing the cut semiconductor memory chip into a package, a second test process of testing semiconductor memories packed into the package under a high temperature; a process of mounting the semiconductor memories subjected to the second test process in a plurality of sockets of a testing board in which the plurality of sockets, a testing circuit for generating addresses and data used for test of the semiconductor memories in accordance with a predetermined algorithm and including a volatile memory for storing data forming the basis for generating data used in a test using a test pattern having no regularity and data generating means for reading out the data from the volatile memory to generate data for the test, terminals for connecting the testing circuit to an external control apparatus, wiring for electrically connecting the sockets, the testing circuit and the terminals are formed, a process of mounting the testing board in a testing apparatus, and a third test process of testing the semiconductor memories by means of the testing apparatus and the testing circuit.

According to the manufacturing method described above, the test which is heretofore performed by an actual machine can be performed by a simple and inexpensive testing apparatus such as a burn-in apparatus and further a large number of semiconductor memories can be also tested at the-same time. A manufacturing cost can be reduced greatly and the time required until shipping of product can be shortened greatly.

DESCRIPTION OF THE EMBODIMENTS

Embodiments of the present invention is now described with reference to the accompanying drawings.

Figure 1:
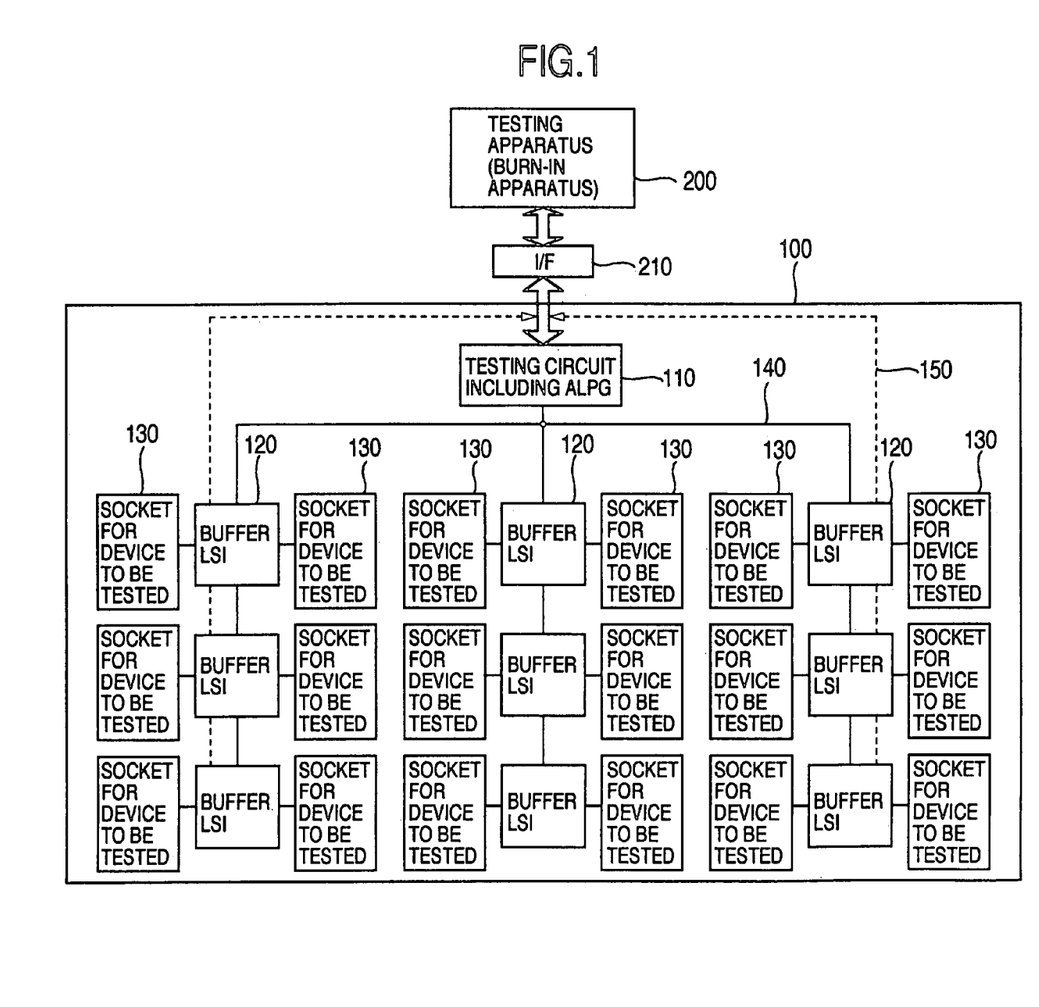
FIG. 1 is a schematic diagram illustrating a testing board according to an embodiment of the present invention.

Referring now to FIG. 1, a testing board on which a plurality of semiconductor memories are mounted to be connected to a testing apparatus so that the plurality of semiconductor memories can be tested at the same time is illustrated.

In FIG. 1, numeral 100 denotes a testing board formed of a printed wiring board, 130 sockets to which devices such as semiconductor memories to be tested are connected, 110 a testing circuit including an ALPG and for generating a test pattern to the devices to be tested, and 120 buffer LSIs for writing data in the devices to be tested while holding a test pattern generated by the testing circuit 110 and reading the written data from the devices to compare the read data with data held in the buffer LSIs so that judgment as to whether the read data are coincident with the held data or not is made and the judgment result is held therein.

As shown in FIG. 1, the testing circuit 110 formed of semiconductor integrated circuit is disposed in the center near one side of the testing board 100 of the embodiment. Three columns of buffer LSIs 120 are arranged on the testing board 100 and the sockets 130 to which the devices to be tested are connected are arranged by one column adjacent to both sides of the buffer LSIs 120 in each column so that six columns of buffer LSIs 120 are arranged in total. The buffer LSIs 120 in each column are connected to the devices to be tested on both sides thereof with the relation of 1 to 2 and also connected through a printed wiring 140 formed on the testing board 100 to the testing circuit 110.

In FIG. 1, the sockets 130 are arranged in 6 columns×3 rows by way of example for simplification of the drawings, while several tens or several hundreds of sockets 130 are arranged, for example, in 8 columns×8 rows on an actual testing board so that the devices are tested in unit of several tens or several hundreds. Further, although not shown, a series of connection terminals are formed on one side (upper side in FIG. 1) of the testing board 100 to be inserted or connected to a connector (slot) provided in a constant temperature oven for tester not shown, so that communication of signals can be made between a controller in a testing apparatus 200 such as a burn-in apparatus and the testing circuit 110 on the testing board through an interface circuit 210. A device protection circuit including resisters, capacitors, fuses and the like for protecting the device to be tested from a surge voltage and the like may be provided near the series of connecting terminals on the testing board 100.

Figure 2:
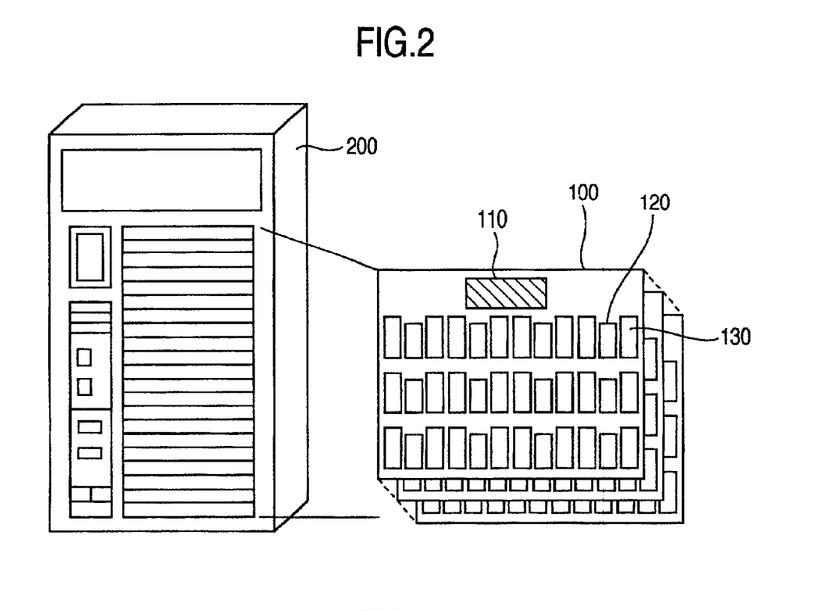
FIG. 2 is a schematic diagram illustrating a testing board and a testing apparatus for controlling the testing board according to an embodiment of the present invention.

The testing boards 100 structured above are mounted in the constant temperature oven of the testing apparatus 200 in unit of, for example, 50 boards as shown in FIG. 2 and are tested at the same time under temperature such as, for example, 125° C. The burn-in apparatus can be used as this testing apparatus. In the testing board of FIG. 1, the testing circuit 110 including the ALPG and the buffer LSIs 120 including the buffer memories are formed in separate semiconductor chips, while these may be formed in a single semiconductor chip or in three or more semiconductor chips.

Figure 3:
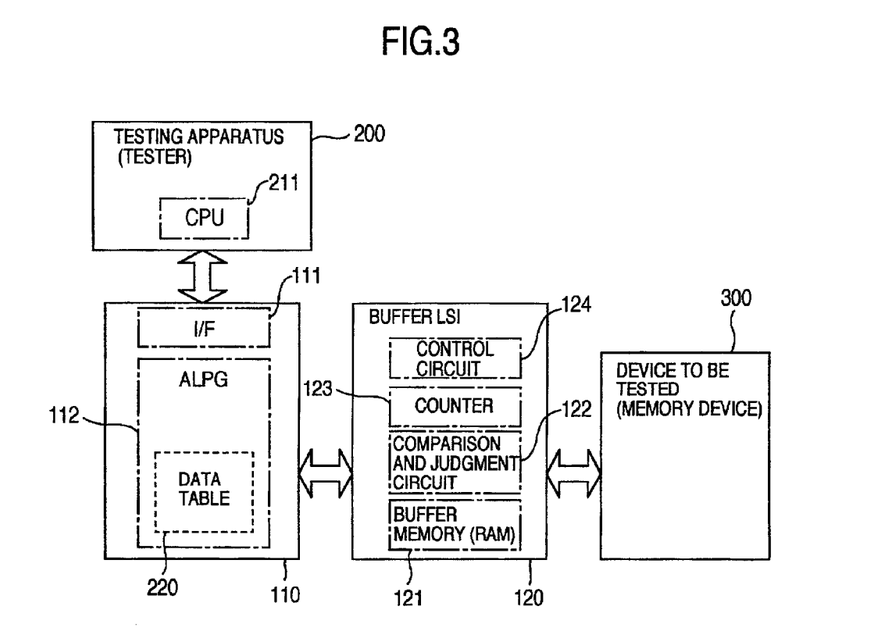
FIG. 3 is a block diagram schematically illustrating a circuit on a testing board according to an embodiment of the present invention.

FIG. 3 schematically illustrates an embodiment of the testing circuit-110 and the buffer LSIs 120 mounted on the testing board 100.

The testing circuit 110 includes an interface circuit 111 for performing transmission and reception of signals between a CPU 211 of the testing circuit 200 disposed outside of the board and the testing circuit 110, and the ALPG 112 for generating a test pattern for the devices to be tested in accordance with a predetermined algorithm and is formed as a semiconductor integrated circuit on a single semiconductor chip. The ALPG of this embodiment includes a data table for storing data utilized to generate a random test pattern. The CPU 211 for controlling the testing circuit 110 may be mounted on the testing board 100 in addition to the testing circuit 110.

The buffer LSI 120 includes a buffer memory 121 for holding a test pattern (addresses and data) generated by the ALPG 112, a comparison and judgment circuit 122 for comparing data read out from the device 300 to be tested with the data held in the buffer memory 121 to judge whether both the data are coincident with each other or not, an address counter 123 for generating addresses used to fetch the test pattern generated by the ALPG into the buffer memory 121 successively, and a control circuit 124 for controlling to supply the test pattern generated by the ALPG 112 to the device 300 to be tested to write the test pattern in the device 300 and to read out the written data from the device 300 and for controlling the buffer memory 121, the comparison and judgment circuit 122 and the counter 123.

Further, the buffer memory 121 holds a comparison result of the comparison and judgment circuit 122 in addition to the test pattern. This embodiment is configured so that the comparison result held in the buffer memory 121 is read out by the CPU 211 of the testing apparatus 200 disposed outside of the board through the testing circuit 110, while the testing board may be structured so that wiring 150 is provided as shown by broken line in FIG. 1, for example, to read the contents of the buffer memory 121 by the outside testing apparatus directly.

Figure 4:
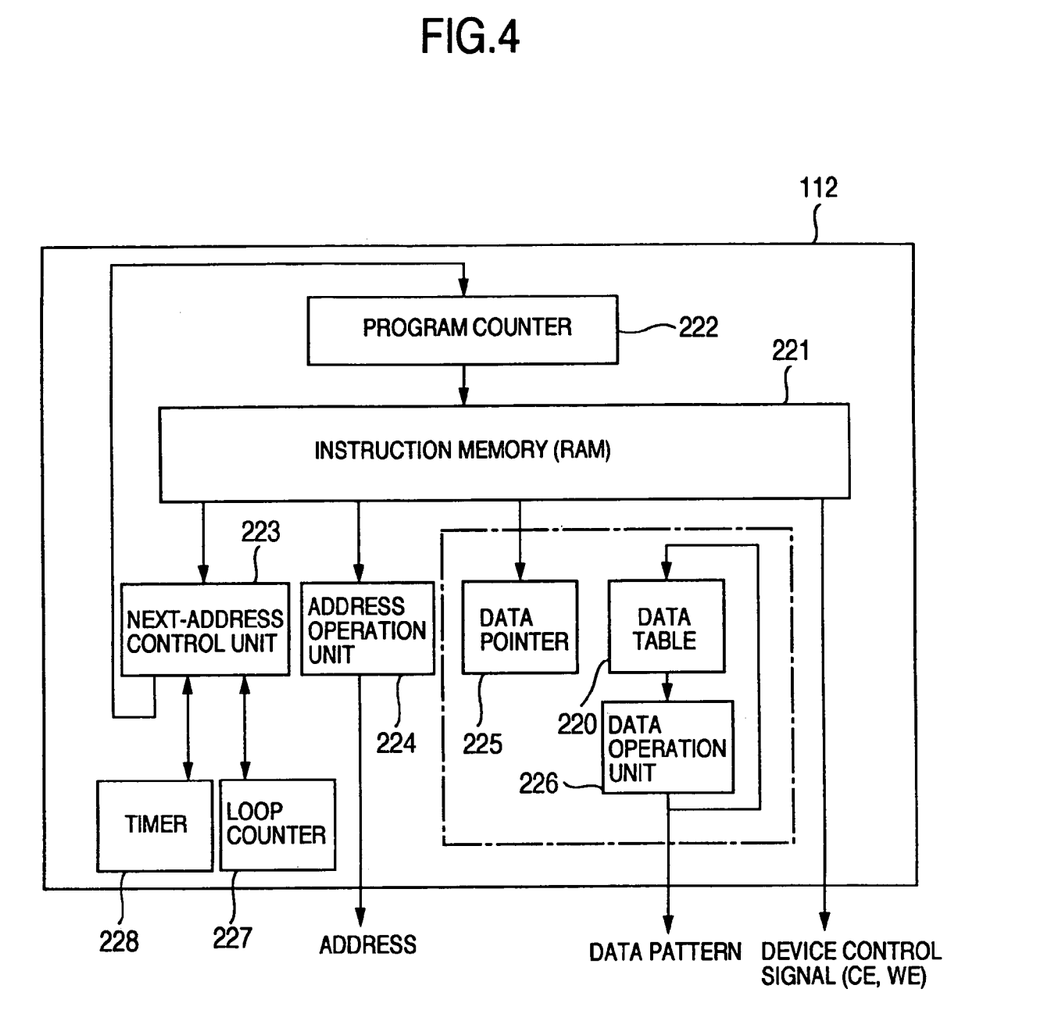
FIG. 4 is a block diagram illustrating an example of an ALPG constituting the testing circuit on the testing board shown in FIG. 3.

FIG. 4 schematically illustrates an embodiment of the ALPG 112 provided in the testing circuit 110.

The ALPG shown in FIG. 4 is to generate the test pattern for the semiconductor memory and includes an instruction memory 221 in which microprograms each composed of a plurality of microinstructions described in accordance with a predetermined test pattern generating algorithm are stored, a program counter 222 for indicating an instruction address of a microinstruction to be read from the instruction memory 221, a next-address control unit 223 for controlling a next address produced by the program counter 222 in accordance with a sequence indication code in the microinstruction read from the instruction memory 221, an address operation unit 224 for generating an address to a memory to be tested in accordance with an address control code in the microinstruction read from the instruction memory 221, a data pointer 225 for indicating a position of data read from the data table 220, and a data operation circuit 226 for generating write data in accordance with a data control code in the microinstruction read from the instruction memory 221 or data read from the data table 220.

The instruction memory 221 in the ALPG is generally configured by a non-volatile memory such as a mask ROM (Read Only Memory), while in this embodiment the instruction memory 221 is configured by a volatile memory such as static RAM (Random Access Memory) or a dynamic RAM. Accordingly, prior to implementation of tests such as marching test, all "0" judgment test, all "1" judgment test, or squared N pattern test (or Galloping test), a microprogram for generation of a test pattern for each test is transferred to the instruction memory 221 from the outside control apparatus 200 each time.

Since the instruction memory 221 is configured by the RAM, the program suitable for test can be transferred to the instruction memory 221 to implement the test each time the kind of test is changed, so that the capacity of the instruction memory 221 can be made relatively small and when a more efficient program or algorithm has been developed, the contents stored in the instruction memory 221 can be changed easily and inexpensively.

Further, the ALPG of the embodiment includes a loop counter 227 for counting the number of times for repeated loops performed by a jump instruction or the like and a timer 228 for management of time. When a regular test pattern is produced, several instructions constituting a microprogram are repeatedly executed many times from a top address to a last address of the memory and accordingly the loop counter 227 is used to count the number of times for repetition. The timer 228 is used to count a time that reading of data by means of the buffer LSI from the device to be tested to which writing is made by a test pattern generated by the ALPG, for example, and judgment of the read data are performed, that is, a waiting time of the ALPG. A chip enable signal CE and a write enable signal WE which are external control signals for the device to be tested are generated by the instruction memory 221 at a predetermined timing.

The generation method of the test pattern having the regularity for the marching test by the ALPG including the instruction memory 221, the address operation unit 224, the data operation unit and the like are publicly known in the aforementioned International Publication WO 98/47152 and the like. Since the generation method of the test pattern having the regularity by the ALPG of the embodiment is the same as the known method, detailed description thereof is omitted.

The data table 220 provided in the embodiment and which is not provided in the conventional ALPG stores or holds data effective in detecting a defect difficult to be detected by the regular test pattern generated by the ALPG and the data pointer 225 indicates a position of data read from the data table 220 at random to thereby generate test data at random.

Figure 5:
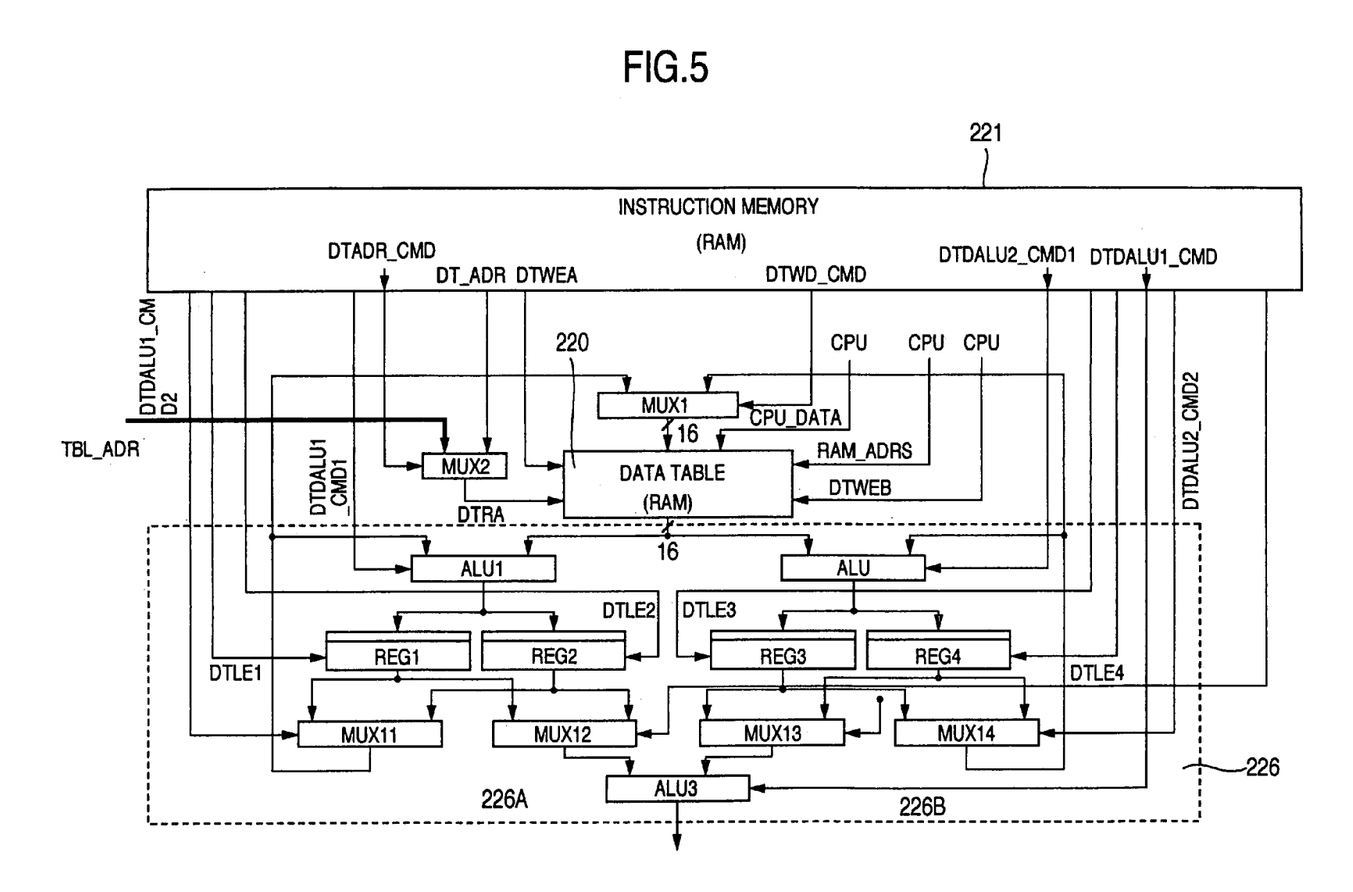
FIG. 5 is a block diagram illustrating an example of a peripheral circuit of a data table and a data operation circuit constituting the ALPG of the testing circuit shown in FIG. 4.

FIG. 5 schematically illustrates a peripheral circuit of the data table 220 and the data operation unit 226 in detail.

The data table 220 is constituted by a dual-port RAM having the memory capacity of, for example, 256 words and one port (low-speed port) can be supplied with data CPU-DATA from an external CPU while the other port (high-speed port) can be supplied with feedback data from the data operation unit 226 through a multiplexer MUX1.

Further, one port of the data table 220 is controlled by an address RAM-ADRS and an enable signal DTWEB from the external CPU and the other port thereof is controlled by an address DT-ADR or TBL-ADR supplied from the instruction memory 221 or the data pointer 225 through the multiplexer MUX2 and an enable signal DTWEA from the instruction memory 221. The multiplexers MUX1 and MUX2 are switched or changed over by control signals DTWD-CMD and DTADR-CMD from the instruction memory 221.

Optimum data for detecting a defect difficult to be detected by the regular test pattern such as the marching test is previously stored in the data table 220 externally before start of the test. That is, the data stored in the data table 220 is random data but is not quite arbitrary data. Even if a defect is difficult to be detected by the regular test pattern, it is understood experientially that data having a certain specific bit pattern is utilized to be written in a memory to be tested to thereby increase a detection ratio and accordingly it is desirable to store such data in the data table 220.

Further, all of 256 words are not previously stored as initial values in the data table 220 and the data table 220 includes an area in which the initial values are stored and an area in which data generated in the data operation unit 226 described later are stored through feedback of the data. Since the data table 220 is configured by the RAM, data suitable for a test can be written in the data table 220 each time the kind of test is changed, so that the capacity of the data table 220 can be made relatively small and when data having higher detection ratio has been found, the data stored in the data table 220 can be changed easily and inexpensively.

Data in the data table 220 stored by the external CPU before start of the test as described above is read out in response to an address DT-ADR supplied from the instruction memory 221 through the multiplexer MUX2 or an address TBL-ADR supplied from the data pointer 225 through the multiplexer MUX2 upon random test. In this connection, not only data used in the ransom test but also initial values used in the regular test such the marching test can be stored in the data table 220.

The data operation unit 226 includes two data operation systems 226A and 226B for operation processing data read from the data table 220 and the fed-back data. The two data operation systems 226A and 226B have the same configuration and accordingly one data operation system 226A is described. The data operation system 226A includes an arithmetic-logic unit ALU1 for performing any logical operation to data read out from the data table 220 and the fed-back data, two registers REG1 and REG2 for holding operation results of the arithmetic-logic unit ALU1, and multiplexers MUX 11 and MUX12 each selecting any one of data held in the registers REG1 and REG2. Data selected by the MUX11 of the two multiplexers is fed back to the arithmetic-logic unit ALU1.

The other operation system 226B includes an arithmetic-logic unit ALU2, registers REG3 and REG4 and multiplexers MUX13 and MUX14 having the similar connection relation. Data selected by the MUX14 of the two multiplexers is fed back to the arithmetic-logic unit ALU2. The data operation unit 226 further includes an arithmetic-logic unit ALU3 for performing any logical operation to data selected by the multiplexer MUX12 of the data operation system 226A or data selected by the multiplexer MUX13 of the data operation system 226B.

These arithmetic-logic units, registers and multiplexers are controlled by control signals from the instruction memory 221. Particularly, the arithmetic-logic units ALUs 1 to 3 can change the kind of operation to be executed in accordance with the control signals from the instruction memory 221. Operation executed by the arithmetic-logic units ALUs 1 to 3 includes logical operation such as exclusive OR, operation processing such as increment, decrement and bit shift in addition to arithmetic operation such as addition and subtraction.

With the provision of the two data operation systems 226A and 226B as described above, one operation system can perform operation of data while the other operation system can output an operation result, so that the processing speed can be increased. In this case, since four registers are provided, data can be outputted at a speed of four times as compared with the case of a single register. Further, in the data operation unit 226 of the embodiment, since the data operation systems 226A and 226B have respective feedback loops, more random data can be produced even if the number of random data stored in the data table 220 is few. Furthermore, in the embodiment, since data obtained by operation in the data operation unit 226 can be fed back even to the data table 220 to be stored therein, more random data can be produced.

In the case of test using a regular test pattern performed heretofore as in the marching test or the like, random data stored in the data table 220 is not used and an initial value is set in any of the registers REG1 to REG4 so that the initial value is outputted or is fed to the arithmetic-logic unit to perform operation thereto to thereby be controlled to produce data.

Figure 6:
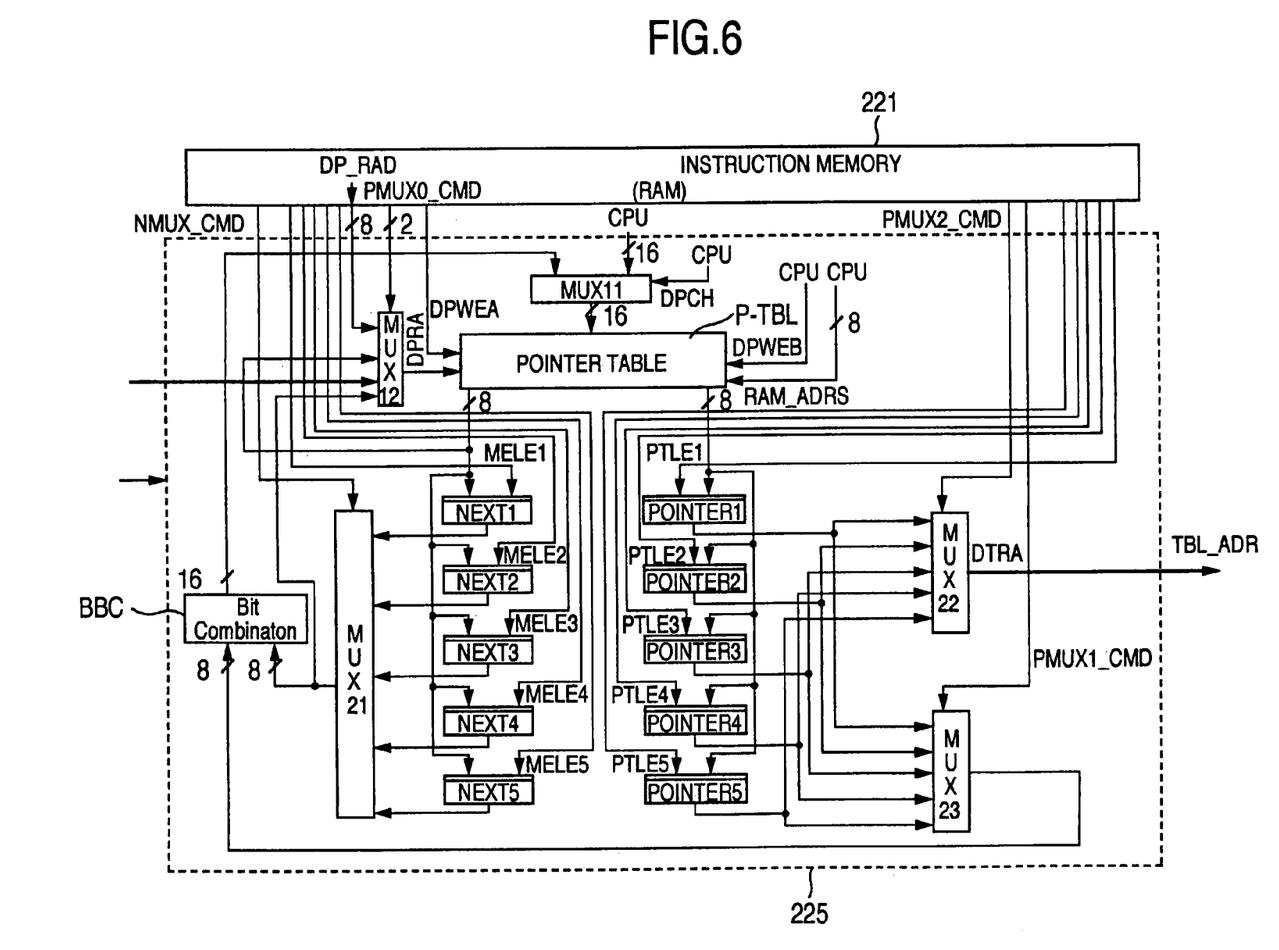
FIG. 6 is a block diagram illustrating an example of a data pointer constituting the ALPG of the testing circuit shown in FIG. 4.

FIG. 6 is a definite schematic diagram illustrating an example of the data pointer 225.

The data pointer 225 includes a pointer table P-TBL constituted by a dual-port RAM having a memory capacity of, for example, 256 words. Data CPU-DATA from the external CPU or data fed back from a register portion REG can be inputted to one port (low-speed port) of the pointer table P-TBL through a multiplexter MUX11 and data read out from the other port (high-speed port) is supplied to the register portion REG.

One port of the pointer table P-TBL is controlled by an address RAM-ADRS and an enable signal DPWEB from the external CPU and the other port thereof is controlled by a start address DP-RAD supplied from the instruction memory 221 or data read out from the pointer table P-TBL or data fed back from the register portion REG through the multiplexer MUX12 and an enable signal DPWEA from the instruction memory 221. The multiplexer MUX11 is switched by a control signal DPCH from the external CPU and the multiplexer MUX12 is switched by a control signal PMUX-CMD from the instruction memory 221.

Figure 7:
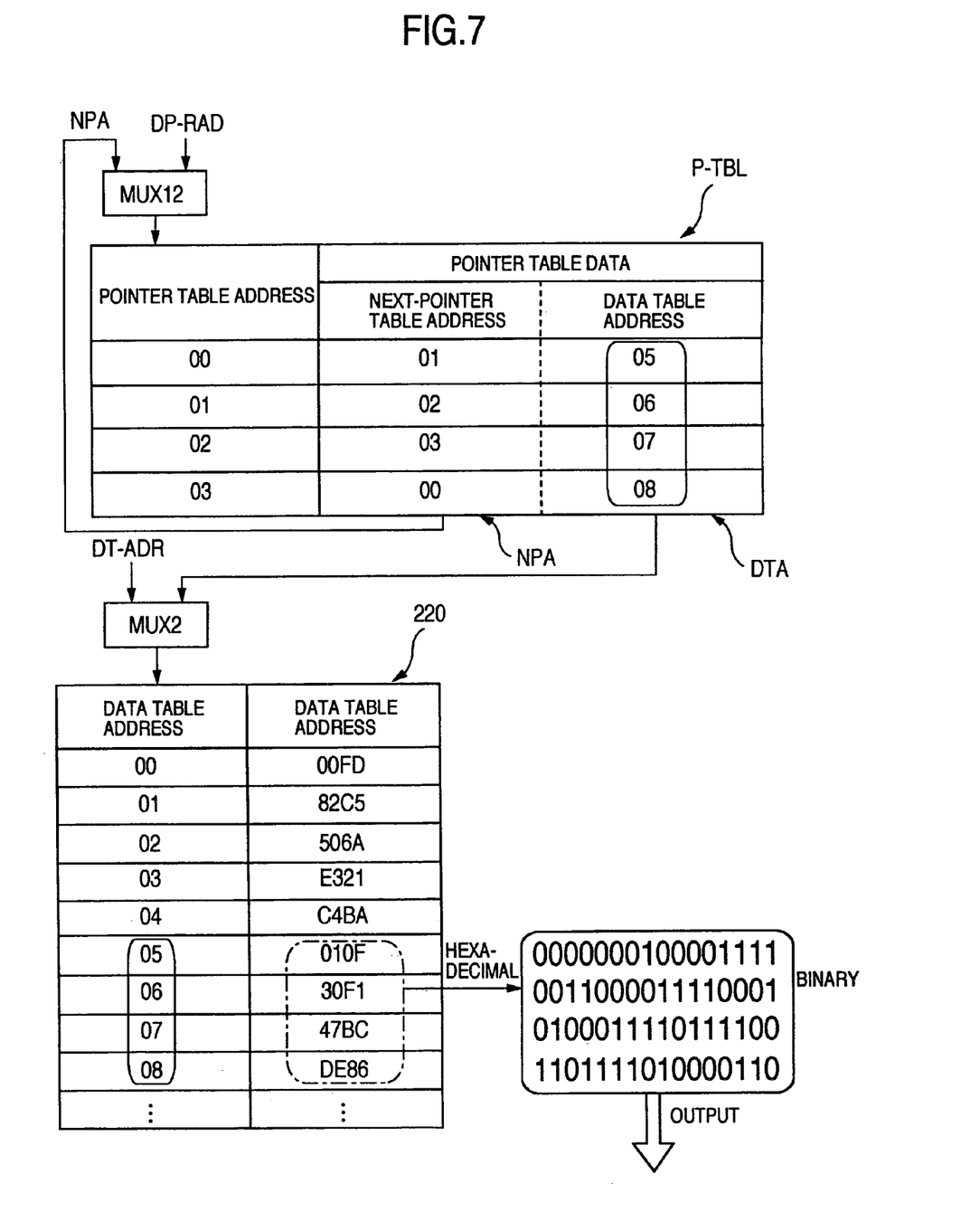
FIG. 7 is a flow chart showing reading operation of data from the data table by means of the data pointer constituting the ALPG of the testing circuit shown in FIG. 4.

As shown in FIG. 7, an address of the pointer table P-TBL itself to be accessed (referred to as next-pointer table address) and an address to be supplied to the data table 220 (referred to as data table address) are stored in the pointer table P-TBL in a pair. The addresses stored in the pointer table P-TBL are random addresses but are not quite arbitrary address. Even if a defect is difficult to be detected by the regular test pattern, it is understood experientially that data having a specific bit pattern are written in the memory to be tested in a certain order to thereby increase a detection ratio and accordingly it is desirable to store data table address in the pointer table so that such data can be read out from the data table 220. All of 256 words are not previously written in the pointer table P-TBL as initial values and the pointer table P-TBL includes an area in which initial values are stored and an area in which data fed back from the register portion REG is written.

The register portion REG includes, as shown in FIG. 6, five next-address registers NEXT1 to NEXT5 in which next-pointer table addresses read from the pointer table P-TBL are held and five pointer registers POINTER 1 to POINTER5 in which data table addresses read out from the pointer table P-TBL are held.

Further, the register portion REG includes a multiplexer MUX21 for selecting one of next addresses held in the next-address registers NEXT1 to NEXT5, a multiplexter MUX22 for selecting one of data table addresses DTRA held in the pointer registers POINTER1 to POINTER5 to supply it to the data table 220, a multiplexer MUX23 for selecting one of data table addresses held in the pointer registers POINTER1 to POINTER5 for the purpose of feedback, and a bit combination circuit BCC for combining the next-address selected by the multiplexer MUX 21 and the data table address selected by the MUX 23. The multiplexers MUX21 to MUX23 are switched by a control signal NMUX-CMD and the like supplied from the instruction memory 221.

As described above, data of the pointer table P-TBL stored therein by the external CPU before start of test are first read out by a starting address DP-ADR supplied from the instruction memory 221 through the multiplexer MUX12 upon random test and are then read in accordance with the next-address read out from the pointer table P-TBL or the address fed back therefrom.

As described above, the register portion REG includes the five next-address registers NEXT1 to NEXT5. One of next addresses held in these registers is selected by the multiplexer MUX21 and is fed back to the pointer table P-TBL to read a data table address. This read-out data table address is taken in the pointer registers POINTER1 to POINTER5 and one of them is selected by the multiplexer MUX22 to supply it to the data table 220, so that random data having no regularity can be read out from the data table 220.

Further, since the pointer table P-TBL is configured by RAM, data optimum for test can be written in the pointer table P-TBL each time the kind of test is changed, so that the capacity of the pointer table P-TBL can be made relatively small and when a more efficient procedure or algorithm has been developed, the contents in the pointer table P-TBL can be changed easily and inexpensively.

Referring now to FIG. 7, operation of the data pointer 225 and the data table 220 is described. FIG. 7 illustrates the multiplexer MUX12 and the pointer table P-TBL shown in FIG. 6 and the multiplexer MUX2 and the data table 220 shown in FIG. 5. As shown in FIG. 7, a next-pointer table address NPA of the data pointer 225 itself to be next accessed and a data table address DTA to be supplied to the data table 220 are stored in the data pointer 225 in a pair. The next-pointer address NPA and the data table address DTA stored in the pointer table P-TBL are read out in accordance with any of an address DP-RAD supplied from the instruction memory 221 or a next-pointer table address NPA read out from the pointer table itself.

The data table address DTA of the data read out from the data pointer 225 is supplied to the multiplexer MUX2 and the data table 220. Reading of the data table 220 is performed in accordance with any of the data table address DTA supplied from the data pointer 225 or the address DT_ADR supplied from the instruction memory 221.

As shown in FIG. 7, when "01" is stored as a next-pointer table address in address "00" of the pointer table P-TBL, "02" in address "01", . . . and "n+1" in address "n", and the register in which a next address read from one of the next-address registers NEXT1 to NEXT5 is stored is coincident with the register selected by the multiplexer MUX21, data are successively read out from the continuous addresses such as addresses "01", "02", "03", "04" . . . in order.

When the multiplexer MUX2 selects an address from the data pointer 225 on condition that the data table addresses DTA paired with the next-table addresses NPA are continuous addresses such as "05", "06", "07", . . . and the register in which the data table address read out from the pointer table P-TBL among the pointer registers POINTER1 to POINTER5 is stored is coincident with the register selected by the multiplexer MUX22, the continuous addresses "05", "06", "07", . . . read out from the pointer table P-TBL are supplied to the data table 220.

At this time, however, the data stored in the addresses "05", "06", "07", . . . of the data table 220 are random data having no regularity such as "010F", "30F1", "47BC", "DE86", . . . and accordingly a random test pattern is outputted. Further, the register in which the next-pointer table address read out from the pointer table P-TBL among the next-address registers NEXT1 to NEXT5 is stored is successively changed or the register in which the data table address read out from the pointer table P-TBL among the pointer registers POINTER1 to POINTER5 is stored is successively changed and the pair of registers selected by the multiplexers MUX21 and MUX23 is changed to feed back the address held in the pair of registers to the pointer table P-TBL to be stored therein, so that the order nonexistent upon initialization can be obtained as the order of data table addresses supplied to the data table 220 to thereby produce more random test pattern from the data table 220.

FIG. 7 shows the test pattern of 4 hexadecimal digits or 16 bits stored in the data table 220 by way of example, while the number of bits of the test pattern is not limited to 16 bits and the number of bits may be decided according to the memory constituting the device to be tested. Further, five next-address registers NEXT and five pointer registers POINTER are provided in the embodiment, while the respective numbers of next-address register and pointer register may be both single. In addition, the number of next-address registers NEXT is not required to be coincident with the number of pointer registers POINTER.

Figure 8:
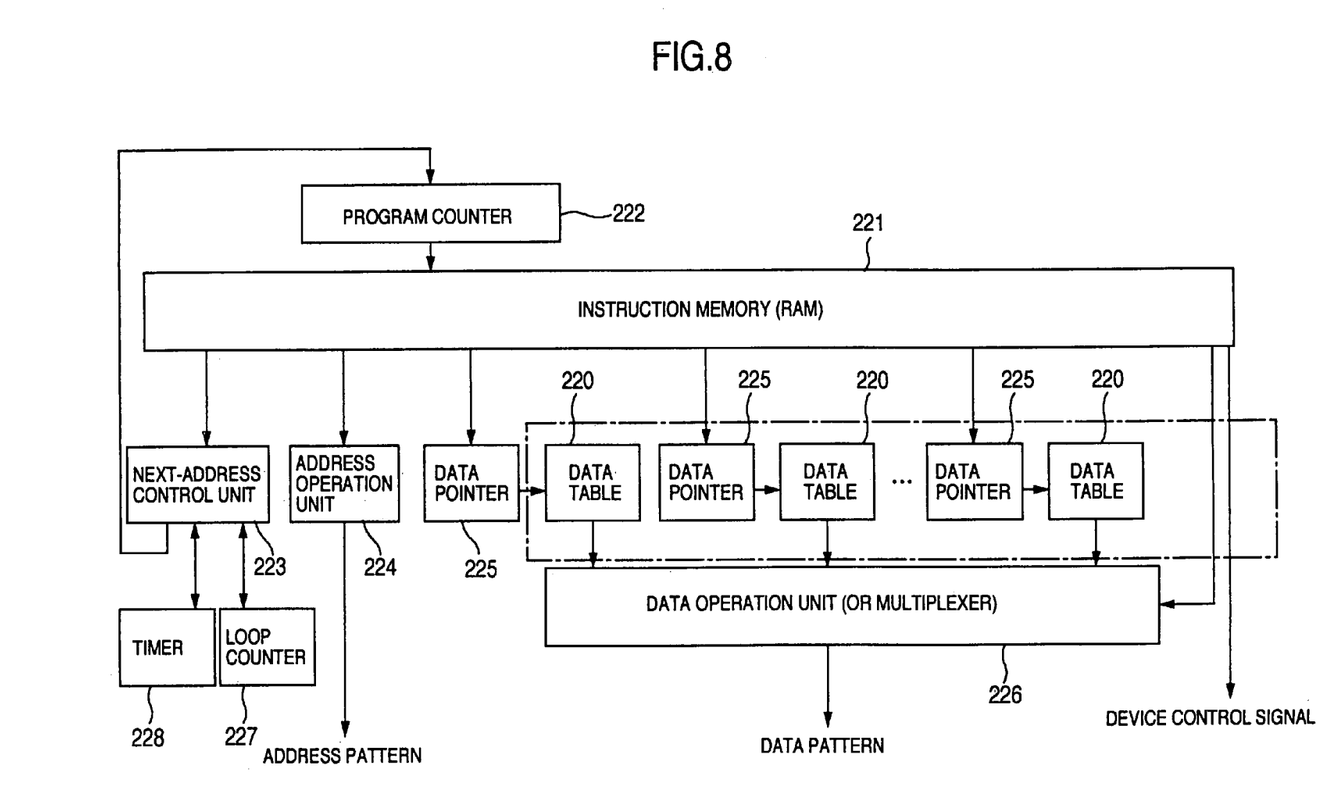
FIG. 8 is a block diagram illustrating an example of the ALPG constituting the testing circuit on the testing board according to an embodiment of the present invention.

FIG. 8 schematically illustrates another embodiment of the ALPG 112 provided in the testing circuit 110. The ALPG of this embodiment includes a plurality of pairs of data tables 220 and data pointers 225 and the data operation unit 226 having the function of a multiplexer so that data from the respective data tables 220 are processed in order. Other configuration and the configuration of each circuit are the same as those of FIG. 4. The circuit blocks having the same or similar function are designated by the same reference numeral and detailed description thereof is omitted.

In this embodiment, data is produced by means of parallel processing of each pair of data table 220 and the data pointer 225, so that the frequency of the test data produced can be made higher and high-speed test can be attained even if the data tables 220 and the data pointers 225 are not so high-speed circuit.

Figure 9:
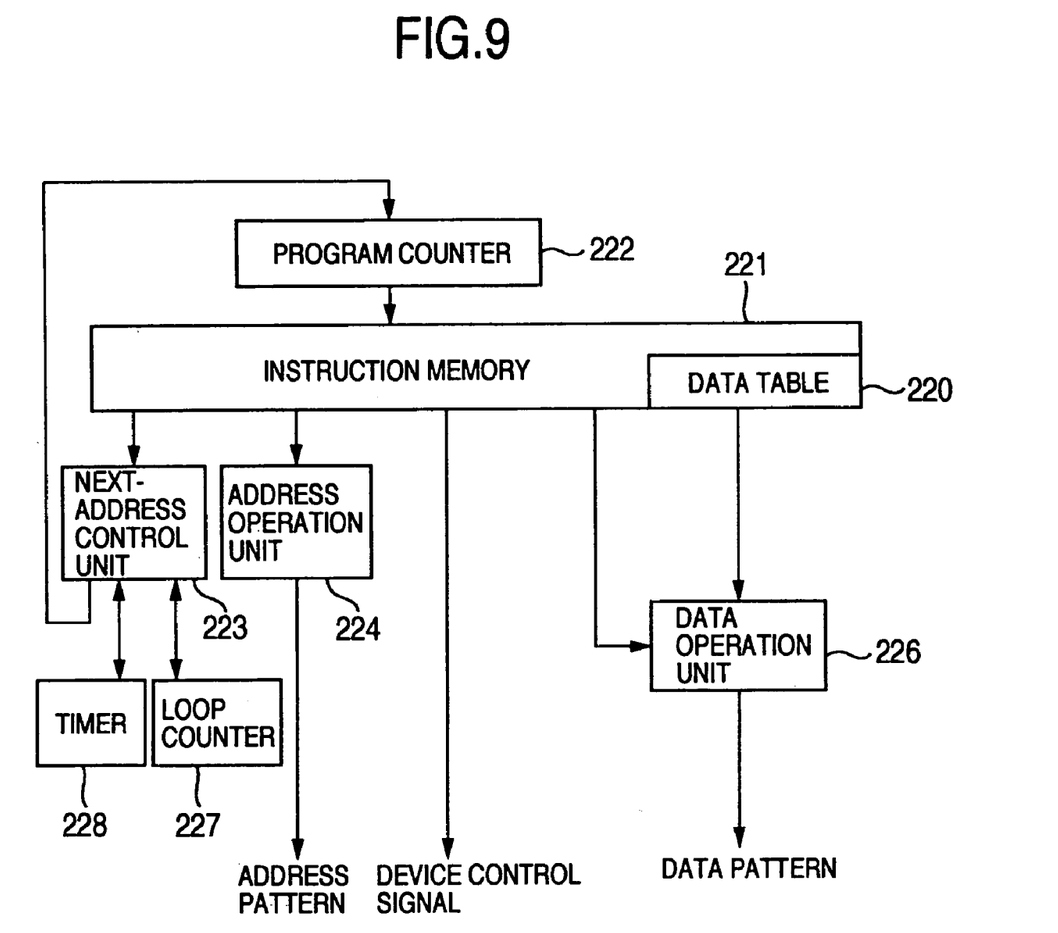
FIG. 9 is a block diagram illustrating an example of the ALPG constituting the testing circuit on the testing board according to an embodiment of the present invention.

FIG. 9 schematically illustrates still another embodiment of the ALPG 112 provided in the testing circuit 110. The ALPG of this embodiment includes the data table 220 provided in the instruction memory 221 and the next-address control unit 223 including the function of the data pointer 225 instead thereof. More particularly, in the ALPG of this embodiment, data suitable for the random test is stored in a part of an instruction code stored in the instruction register 221 and when a next instruction code is read out in response to an address from the next-address control unit 223, data of the data table 220 is read out concurrently to be supplied to the data operation unit 226. Consequently, in the ALPG of this embodiment, although the capacity of the instruction memory 221 is increased as compared with the ALPGs of the FIGS. 4 and 8, it is advantageous that the scale of other circuits becomes considerably small. Further, since only one memory is required, initialization can be unified so that processing performed before start of test is simplified and preparation time is reduced.

Figure 10:
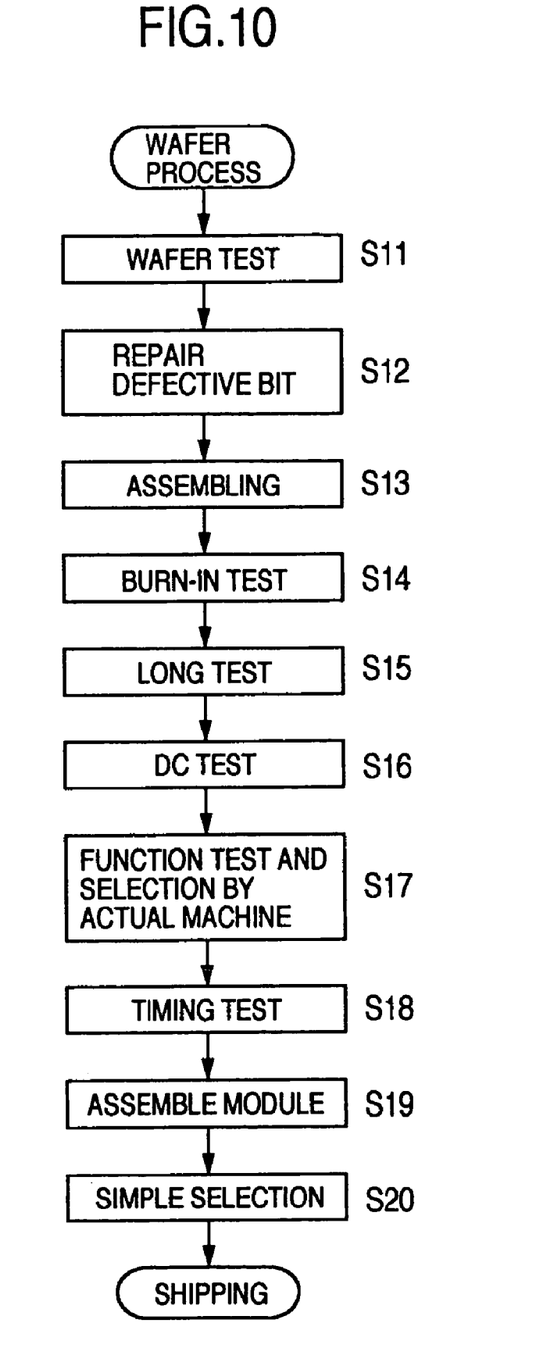
FIG. 10 is a flow chart showing a test procedure for semiconductor memories using a testing board according to an embodiment of the present invention.

Referring now to FIG. 10, procedure from manufacture to shipping of semiconductor memories in case where the testing board of the embodiment is used is described.

According to the embodiment, after a plurality of semiconductor memories have been formed on a wafer in the semiconductor manufacturing process, probes come into contact with pads of each memories being formed on the wafer to supply test signals thereto and receive output signals in response to the test signals so that a probe test is performed (step S11). The semiconductor memories are classified into repairable devices and non-repairable devices on the basis of the test result. With respect to the repairable devices, a repair circuit (redundant circuit) provided within each memory is used to replace a defective bit with a spare memory cell (step S12).

Next, the wafer on which the plurality of semiconductor memories are formed is cut into respective chips and each chip is enclosed or sealed by means of sealing material such as resin to be assembled into a package (step S13). The semiconductor memories each assembled into the package are subjected to a high-temperature test (burn-in test) by means of a burn-in apparatus and to an operation test at a low speed (long test) by means of a signal such as a clock having a low operation frequency to thereby remove a device having unstable operation on the basis of the test result (steps S14 and S15).

Then, a DC voltage is applied to perform a DC test for testing whether the semiconductor memories have a desired DC voltage characteristic (step S16). This DC test is heretofore performed by a high-speed memory tester capable of performing a functional test too, while in the embodiment the DC test can be performed by a simple dedicated tester capable of performing only the DC test. Next, a function test for testing whether circuits are operated normally at usual operation speed with original operation frequency signals is performed (step S17).

This functional test is heretofore performed by means of a high-speed memory tester, while in the embodiment the devices to be tested are mounted on the testing board of the embodiment and the testing board having the devices mounted thereon is put in, for example, the burn-in apparatus. Then, the testing circuit on the testing board is operated so that the functional test can be performed. At this time, the conventional tester performs only the test using the test pattern having regularity according to a predetermined algorithm, while the test is performed concurrently with the functional test. Further, since the testing circuit on the testing board of the embodiment is configured to be able to perform the test in which the random test pattern having no regularity is generated, the selection test using an actual machine performed after a module has been assembled heretofore as shown in FIG. 11 can be also performed concurrently with the functional test.

When the functional test and the selection test using the actual machine have been completed, a timing test for testing whether a set-up time and a hold time of the semiconductor memories satisfy design specification is performed (step S18). This timing test is heretofore performed by a high-speed memory test capable of also performing the functional test, while in the present invention the timing test can be performed by a simple dedicated tester capable of performing only the timing test.

The semiconductor memories regarded as non-defective devices in the above tests are used to assemble a memory module. The memory module is subjected to the selection test. Only the memory module judged as a normally operated module is shipped as a product (step S19 and S20). The selection test after assembly of the module is heretofore performed as a test similar to the test using the random test pattern having no regularity and performed by the testing circuit on the testing board of the embodiment by means of a CPU of a computer in a unit of several modules, while in the embodiment the selection test is not the test using the random test pattern and is a simple test for judging whether the memories on the modules are operated on the respective modules or not. Accordingly, a simple module-dedicated tester can be used to subject the a lot of modules to the selection test simultaneously.

As described above, the present invention made by the Inventors has been described definitely with reference to the embodiments, while the present invention is not limited to the embodiments and it is needless to say that various changes can be made thereto without departing from the gist thereof. For example, in the embodiments, a RAM is used as the instruction memory 221 of the ALPG, while a ROM may be used as the instruction memory 221.

Furthermore, in the embodiment, the buffer LSI having the buffer memory 121 and the comparison and judgment circuit 122 is provided separately from the testing circuit 110 having the ALPG and the data generated by the ALPG and written in the device to be tested are held in the buffer memory. After writing of the data, the data read out from the device to be tested is compared with the data stored in the buffer memory in the comparison and judgment circuit of the buffer LSI to make judgment. However, the buffer LSI may be omitted and the comparison and judgment circuit may be provided in the testing circuit so that the ALPG generates an address for reading and an expected data corresponding thereto and the data read out from the device to be tested is compared with the expected data in the comparison and judgment circuit of the testing circuit to make judgment.

In the foregoing description, the invention made by the Inventors has been described by taking the testing board and the testing method of the semiconductor memories described in the utilization field in the background of the invention as an example, while the present invention is not limited thereto and can be utilized even in the testing board and the testing method of logical LSIs.

According to the embodiments described above, the number of high-speed and high-function testers used in the test can be reduced to decrease the cost of equipment and time required for the test can be made shorter.

The invention claimed is:

1. A testing board comprising:
   a plurality of sockets in which a plurality of semiconductor memories to be tested are adapted to be mounted respectively;
   a testing circuit for generating first data and first addresses used for a first test in accordance with a first predetermined algorithm to the plurality of semiconductor memories;
   a buffer circuit having a buffer memory for holding the first data generated by the testing circuit and a comparison and judgment circuit for comparing the first data stored in the buffer memory with second data read from the semiconductor memory being adapted to be mounted in the socket to detect whether the first and second data are coincident with each other or not,
   terminals for connecting the testing circuit to an external control apparatus, and
   wiring for electrically connecting the plurality of sockets, the buffer circuit, the testing circuit and the terminals, wherein the testing circuit comprises:
   a volatile memory for storing third data forming a basis for generating fourth data used in a second test using a test pattern having no regularity to the plurality of semiconductor memories, and
   data generating means for reading out the third data from the volatile memory to generate the fourth data for the second test.

2. A testing method for testing a plurality of semiconductor memory devices, comprising:
   a first process of testing a plurality of semiconductor memory chips on a wafer;
   a second process of testing, under a high temperature, a plurality of semiconductor memory devices each of which is packed in one package and each of which includes one semiconductor memory chip cut from the wafer; and
   a third process of testing, by a test circuit on a testing board, ones of the plurality of semiconductor memory devices which go through the second process and which are mounted in a plurality of sockets on the testing board, wherein the testing board includes:
   the plurality of sockets,
   the test circuit which executes a test operation in accordance with a predetermined algorithm to the plurality of semiconductor memory devices and which includes a volatile memory for storing first data for generating second data used in a test using a test pattern having no regularity to the plurality of semiconductor memory devices,
   a data generating circuit which reads out the first data from the volatile memory to generate the second data for the test,
   terminals for coupling the testing circuit to an external control apparatus, and
   wirings for electrically coupling the plurality of sockets, the testing circuit and the terminals.

3. A testing method according to claim 2, wherein the second process is executed to each of the plurality of the semiconductor memory devices which is classified into a repairable device based on a test result of the first process, wherein the third process is executed to ones of the plurality of the semiconductor memory devices except for devices having an unstable operation based on a test operation of the second process.

4. A testing method according to claim 2, wherein both the testing, under high temperature, a plurality of semiconductor memory devices and the testing, by a test circuit on a testing board, ones of the plurality of semiconductor memory devices, are performed by an external control apparatus.

5. A method for manufacturing semiconductor memory devices, comprising:
   a first step for testing a plurality of semiconductor memory chips formed on a wafer;
   a second step for cutting each of the plurality of semiconductor memory chips from the wafer;
   a third step for packing ones of the cut semiconductor memory chips into packages, respectively, to form semiconductor memory devices;
   a fourth step for testing the semiconductor memory devices under a high temperature;
   a fifth step for mounting ones of the semiconductor memory devices subjected to the fourth step in a plurality of sockets of a testing board, wherein the testing board includes:
   the plurality of sockets,
   a testing circuit for executing a test operation in accordance with a predetermined algorithm to the semiconductor memory devices and including:
   a volatile memory for storing first data forming a basis for generating second data used in a test using a test pattern having no regularity to the semiconductor memory devices, and
   data generation means for reading out the first data from the volatile memory to generate the second data for the test,
   terminals for connecting the testing circuit to an external control apparatus, and
   wiring for electrically coupling the plurality of sockets, the testing circuit and the terminals;
   a sixth step for mounting the testing board in the external control apparatus; and a seventh step for testing the ones of the semiconductor memory devices mounted in the plurality of sockets by means of both the external control apparatus and the testing circuit.

6. A method according to claim 5, wherein the fifth step is executed to ones of the plurality of the memory devices except for devices having an unstable operation based on a test operation of the fourth step.

* * * * *